(12) United States Patent
Morimoto

(10) Patent No.: US 7,002,837 B2
(45) Date of Patent: Feb. 21, 2006

(54) NON-VOLATILE SEMICONDUCTOR MEMORY DEVICE

(75) Inventor: Hidenori Morimoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 10/794,633

(22) Filed: Mar. 5, 2004

(65) Prior Publication Data

US 2004/0174732 A1    Sep. 9, 2004

(30) Foreign Application Priority Data

Mar. 6, 2003    (JP) .............................. 2003-059993

(51) Int. Cl.
*G11C 7/00* (2006.01)
(52) U.S. Cl. ..................... 365/148; 365/158
(58) Field of Classification Search ............... 365/158, 365/145, 171, 148
See application file for complete search history.

(56) References Cited

U.S. PATENT DOCUMENTS

| | | | | |
|---|---|---|---|---|
| 5,119,329 A | * | 6/1992 | Evans et al. ................. | 365/145 |
| 5,894,447 A | * | 4/1999 | Takashima ................... | 365/158 |
| 6,226,197 B1 | | 5/2001 | Nishimura ................... | 365/158 |
| 6,331,943 B1 | | 12/2001 | Naji et al. ................... | 365/158 |
| 2003/0001178 A1 | | 1/2003 | Hsu et al. ................... | 257/296 |
| 2003/0003674 A1 | | 1/2003 | Hsu et al. | |

FOREIGN PATENT DOCUMENTS

EP    1 162 672    12/2001

OTHER PUBLICATIONS

European Search Report mailed Jul. 1, 2004, for EP Application No. 04251240.0, three pages.

* cited by examiner

*Primary Examiner*—Vu A. Le
(74) *Attorney, Agent, or Firm*—Morrison & Foerster LLP

(57) ABSTRACT

The present invention is intended to realize executing high-speed program and erasure by using a NAND type memory cell unit that suits high degree of integration and to realize providing a highly reliable non-volatile semiconductor memory device. A memory cell is made up of a cell transistor (Tij) that is formed on the semiconductor substrate and a variable resistive element (Rij) that is connected between a source and drain terminals of the cell transistor (Tij) and the resistance value of that varies depending on applying a voltage and that is formed of the oxide having a perovskite structure that contains manganese. By connecting a plurality of the memory cells in series, there is formed a memory cell connected-in-series part. Then a memory cell block is prepared by providing a selection transistor (Si) to at least one end of the memory cell connected-in-series part. By disposing more than one such memory cell block, there is constructed a memory cell array.

7 Claims, 16 Drawing Sheets

NON-VOLATILE SEMICONDUCTOR MEMORY DEVICE

BACKGROUND OF THE INVENTION

1. Field of the Invention

The present invention relates to a non-volatile semiconductor memory device that uses a variable resistive element the resistance value of that varies by applying a voltage with respect thereto and a driving method for the non-volatile semiconductor memory device.

2. Description of the Related Art

Conventionally, a NAND type flash EEPROM is known as an EEPROM (Electrically Erasable and Programmable Read Only Memory) with respect to that high degree of integration can be performed. A memory transistor of the NAND type flash EEPROM has a stacked-gate structure wherein, on the semiconductor substrate, an electric-charge accumulation layer (floating gate) and a control gate are formed in the way of their being stacked with an insulating film in between. An example of the NAND type flash EEPROM is illustrated in FIGS. 15 to 18. FIG. 15 is an equivalent circuit diagram illustrating a memory array of the NAND type flash EEPROM; FIG. 16 is a plan view illustrating a layout corresponding to the circuit illustrated in FIG. 15; and FIG. 17 is a sectional view illustrating a layout taken along a line A–A' of FIG. 16. In FIG. 15, MC0 to MC31 represent memory cells; BL0 to BL4223 represent bit lines; WL0 to WL 31 represent word lines; SSTs and GSTs represent selection transistors; and SSL and GSL respectively represent selection signals with respect to the selection transistors SST and GST. In FIGS. 16 and 17, a reference numeral 19 denotes a metal wiring layer; a reference numeral 15 denotes a floating gate; a reference numeral 17 denotes a control gate serving as a word line; a reference numeral 14 denotes a tunnel oxide film; reference numerals 16 and 18 denote inter-layer gate insulating films, respectively; reference numerals 21, 21a, and 21b each denote a source or drain region of the memory cells MC0 to MC 31; a reference numeral 10 denotes a p-type silicon substrate; a reference numeral 11 denotes an n-type well; a reference numeral 12 denotes a p-type well; and a reference numeral 13 denotes a for-elemental-isolation insulating film. Like this, as illustrated in, for example, FIG. 15, the NAND type flash EEPROM is made up into a structure wherein, for example, 32 pieces of memory cells MC0 to MC31 are arranged in series and, at both ends of the arrangement, there are disposed the selection transistors SST and GST. For this reason, as illustrated in FIGS. 16 and 17, adjoining two of the memory cell transistors can share a source, or a drain region and therefore it is possible to greatly reduce the memory size per bit and thereby to suppress the increase in the chip area. Like this, the NAND type flash EEPROM has the greatest feature as a large capacity file memory that its cell size is small and that therefore the bit cost is low.

The memory cell transistor performs non-volatile storage therein of data in dependence upon the state of its floating gate in which electric charge is accumulated. Specifically, setting, for example, as data "0" the high-threshold voltage state of floating gate in which electrons have been injected from a relevant channel and as data "1" the low-threshold voltage state of floating gate in which electrons therein have been discharged into the channel, storage of 2-level data is performed. Recently, multi-level storage such as storage of 4-level data has also been performed by more finely controlling the distribution of the threshold values.

Here, the programming operation of the NAND type EEPROM will be explained with reference to FIG. 18. It is to be noted that, in the following description, a plurality of memory cells that are connected in series are referred to as "the block". When programming data, the data within the NAND-cell block is collectively erased in advance. This is executed by applying an earth potential Vss to all control gate lines WL0 to WL31 (word lines), then applying an increased level of positive erasing voltage Vera (for example an erasing pulse of 3 milliseconds and 21V) to the p-type well region (12 in FIG. 17) of the cell array, and thereby discharging the electrons accumulated in the floating gate into the relevant channel. As a result of this, all data within the NAND-cell block is brought to a state of "1" (a state of being erased). Writing data, after the above-described collective erasure has been performed, is collectively executed with respect to a plurality of memory transistors (this region is ordinarily called "1 page") that are connected along the control gate line, sequentially selected from the source side.

In the programming operation, to the word line (here WL17) that has been selected there is applied an increased level of positive voltage Vpgm; to the unselected word lines (WL0 to WL16 and WL18 to WL31) that have not been selected there is applied an intermediate potential Vpass; to the selected gate line SSL for the bit lines (BL0 and BL1) there is applied a voltage Vcc; and to the selected gate line GSL on the common source SL side there is applied a voltage Vss (=0V). Also, to the bit line BL0 with respect to which data "0" is to be written there is applied a voltage Vss while, on the other hand, to the bit line BL1 with respect to which data "1" is to be programmed or in a state of data's programming inhibited for maintaining an erased state there is applied a voltage Vcc.

At this time, in the selected memory cell MC 170 that is connected to the bit line BL0 that has been applied with a voltage Vss, the potential of the channel is maintained at the level of Vss and a high magnitude of electric field is applied between the control gate that has been applied with the voltage of Vpgm and the channel region. As a result of this, the phenomenon of the electrons' being injected from the channel region to the floating gate due to the tunnel current occurs. However, in the other unselected memory cells that are connected to the same bit line BL0 and that have been applied with the intermediate potential of Vpass, a sufficiently high magnitude of electric field is not applied thereto. Therefore, programming data is not executed there.

On the other hand, the memory cells that are located along the bit line BL1 that has been applied with the voltage of Vcc become cut off as a result of the channel region's of the NAND cell being preliminarily charged to a voltage of Vcc or Vcc–Vth (the Vth represents the threshold voltage of the selected memory cell). And, owing to the series capacitive coupling prepared using the control gate 17, floating gate 15, channel region, and p-type well 12, the control gates being applied with the programming voltage Vpgm and intermediate voltage Vpass, the potential of the channel region gets increased. This obstructs the occurrence of the phenomenon that the electrons are injected from the channel into the floating gate.

In the above-described way, injection of the electrons into the floating gate occurs only in the memory cell M170 at the portion of intersection of the bit line BL0 applied with the voltage Vss and the selected word line WL 17 applied with the voltage Vpgm. As a result of this, programming data "0" into any of the other memory cells is inhibited. In contrast, in the programming-inhibited memory cells within the selected block, as described above, the potential of the channel is determined depending on the capacitive coupling between the word line and the channel region of the NAND cell. However, in case of the NAND type flash EEPROM, the movement of the electric charge that follows the programming and erasing operations takes place due to the FN (Fowler-Nordheim) tunnel phenomena. Therefore, the programming/erasing length of time is as unsuitable, as given in milliseconds, to the application requiring the execution of high-speed programming and erasure.

As another example using a NAND type cell array structure such as that described above there is disclosed in the specification of, for example, U.S. Pat. No. 6,331,943 a NAND type Magnetic Random Access Memory (NAND type MRAM) with a structure wherein a plurality of memory cells each having a magnetic resistive element and a MOS transistor connected thereto in parallel are connected in series; and a selection gate is disposed at least one of both ends of the connected-in-series arrangement. It is illustrated in FIGS. 19 and 20. FIG. 19 is an equivalent circuit view illustrating the NAND type MRAM; FIG. 20 is a sectional view illustrating the layout of one memory cell block (for example, a memory cell block 26) in the equivalent circuit illustrated in FIG. 19. In FIG. 19, reference numerals 30, 32, 34, and 36 respectively denote magnetic resistive elements that will serve as memory carriers; reference numerals 31, 33, 35, and 37 respectively denote cell selection transistors that select their corresponding magnetic resistive elements; WL0 to WL3 denote word lines that supply gate control signals for the cell selection transistors; a reference numeral 38 denotes a selection transistor for selecting the memory block; and SS0 and SS1 each denote a control gate signal for the selection transistor. In FIG. 20, the same portions as those in FIG. 19 are denoted by like reference symbols. Incidentally, the magnetic resistive element that are represented by the reference numerals 30, 32, 34, and 36 are each a magnetic tunnel junction (MTJ=Magnetic Tunnel Junction) element; and reference numerals 46 to 49 are each a programming word line. Writing data into the MTJ element is executed by causing an electric current to flow into the programming word line to generate a magnetic field in the neighborhood of it and, using this magnetic field, inverting the magnetic moment of a free-magnetic-body layer provided within the MTJ element.

In the above-described NAND type cell array structure, by the cell selection transistors' 31, 33, 35, and 37 being connected in series, two adjoining of them can share the source/drain region. Therefore, as in the case of the NAND type flash EEPROM, it is possible to greatly decrease the memory size per bit. For comparison, in FIGS. 21 and 22, there are illustrated an equivalent circuit of a so-called NOR type magnetic random access memory (NOR type MRAM) using a magnetic resistive element, in which there is adopted no serial structure for memory cells such as that illustrated in FIGS. 19 and 20, and a sectional view that sections the layout of an elemental structure thereof. In FIG. 21, a reference numeral 49 denotes a magnetic resistive element, a reference numeral 50 denotes a cell selection transistor, a reference numeral 51 denotes a global bit line GBL, a reference numeral 52 denotes a local bit line LBL, a reference numeral 53 denotes a selection transistor for selecting a memory block 48, WL0 to WL3 denote word lines, and SS0 and SS1 denote control gate signals for the selection transistors. In FIG. 22, the same portions as those in FIG. 21 are denoted by like reference numerals or symbols. Here, as in the case of FIG. 20, a reference numeral 49 denotes a MTJ element while a reference numeral 66 denotes a programming word line. Comparing with FIG. 20, in FIG. 22, it is seen that there is the need to use contacts 67 for applying an earth potential to the source electrode of the cell selection transistor as well as separation regions 68 for making separation between the cell selection transistors. Like this, in the NAND type cell construction illustrated in FIGS. 19 and 20, it is possible to suppress the increase in the chip area relative to the memory cell array, such as that illustrated in FIGS. 21 and 22, in which the memory cell having a magneto-resistive element and a transistor connected in series with respect thereto is connected to the bit line.

As stated before, in the NAND type MRAM, each of the magneto-resistive elements 30, 32, 34, and 36 connected in parallel to the cell selection transistors is constructed using a magnetic tunnel junction (MTJ) element that is comprised of, for example, a ferromagnetic layer/insulating layer/ ferromagnetic layer (for example, NiFe/AlO/NiFe). And, in this case, the resistance value varies depending on whether the direction of the spin in the ferromagnetic layer is parallel or contra-parallel. In a case where the size of the MTJ element is, for example, $0.4\,\mu m \times 0.8\,\mu m$, the resistance value is approximately 10 kΩ, and the rate of change in resistance (the MR ratio=Magneto-resistance Ratio that is expressed as the ratio between the value of the low resistance and (the value of the high resistance–the value of the low resistance)), when converted in percentage, is approximately 30% or so.

The data programming/erasing operation is performed by inverting the direction of the spin in one ferromagnetic layer called "a free layer" using a magnetic field that generates by causing an electric current to flow into the programming word lines 46, 47, 48, and 49 and into the bit line 29. The programming/erasing speed is as fast as given in nanoseconds because of the magnetization direction's being inverted.

The reading operation is performed as follows. When explaining using FIG. 19 or 20, a voltage of Vcc is applied to the bit line 29 that is to be selected; a voltage of Vcc is applied to the selection gate SS0 that is connected to the memory cell that is to be selected; a voltage of Vss (=0V) is applied to the selected word line WL2; and a voltage of Vcc is applied to the unselected word lines WL. The voltage of Vcc is applied to the bit-line side of the magnetic resistive element 32 and the voltage of Vss is applied to the source side of it, thereby reading the resistance value of the magnetic resistive element 32.

However, as illustrated in FIG. 20, since a wiring layer 100 is disposed between the bit line and the magnetic resistive element, the distance between the bit line 29 and the magnetic resistive elements 32, 34, 36, and 38 gets increased relative to the distance between the bit line 52 and magnetic resistance element 49 of the memory array of the NOR type MRAM illustrated in FIGS. 21 and 22. Resultantly, when performing programming/erasing operations for data, the amount of electric current that is caused to flow into the bit line 29 becomes relatively large compared to that in the case of the NOR type MRAM. Therefore, in the NAND type MRAM, the electro-migration problem in the bit line arises. Namely, since the intensity of the magnetic field that generates around the bit line weakens depending on the distance that is relevant, to compensate for that the necessity of causing a larger amount of current to flow into the bit line comes up. This may become a factor to cause the occurrence of the migration problem.

As has been described above, the memory array using the NAND type memory cell units has, in addition of the contact with the bit line, the merit of the source line's being shared by adjoining two of the connected-in-series memory cells.

Therefore, it is possible to greatly reduce the memory size per bit and to suppress the increase in the chip area. Considering the above, this memory array is very advantageous so long as the story is concerned with the high level of integration. However, in case of the NAND type flash EEPROM, the programming/erasing length of time is as large as given in milliseconds while, on the other hand, in case of the NAND type MRAM, it has the problem that a large amount of electric current becomes necessary.

SUMMARY OF THE INVENTION

The present invention has been made in view of the above-described points of problem and has an object to provide a highly reliable non-volatile semiconductor memory device which solves the above-described points of problem and which realizes executing high-speed programming and erasure by using a NAND type memory cell unit that suits high degree of integration.

To attain the above object, the non-volatile semiconductor memory device according to the present invention has the following first characterizing constructional feature. Thus, the non-volatile semiconductor memory device comprises a memory cell array which includes a plurality of memory cells disposed in array, wherein the memory cell includes a transistor that is formed on a semiconductor substrate, and a variable resistive element that is connected between a source and drain terminals of the transistor and the resistance value of that varies by applying a voltage.

According to the first characterizing constructional feature of the non-volatile semiconductor memory device, if turning off the transistor composing the memory cell and applying a prescribed level of voltage to both ends of the memory cell, in the reading operation it is possible to reading data that has been stored using the variable resistive element as a storing carrier by discriminating the change in the reading current that corresponds to the resistance values of the variable resistive element. Also, by turning on the transistor, the electric current that flows through that transistor becomes overwhelming. Therefore, this corresponding memory cell can be brought to an unselected state in which it is not a reading object. As a result of this, it can be made distinct from the selected memory cell in which the transistor is kept "off". Further, in the programming or erasing operation as well, with respect to the memory cell that is a programmed/erased object, the transistor composing that memory cell is turned off. In this condition, there is adjusted the value, or polarity, of the voltage that is applied to both ends of the memory cell as in the case of the reading operation. By doing so, it is possible to vary the resistance value of the variable resistive element and therefore it becomes possible to execute storing (program/erasure) of data using the variable resistive element as a storing carrier. Also, regarding the unselected memory cell as well, by turning on the transistor of the unselected memory cell as in the case of the reading operation, the program or erasure voltage that is to be applied to both ends of the variable resistive element becomes stopped from being applied by the transistor that is kept on. Therefore, storing (programming or erasing) the data can be selectively prohibited. That is to say, it is possible to provide a semiconductor memory device which, by selecting as the variable resistive element the material that enables appropriately adjusting the amplitude and width of a pulse voltage applied to both ends of the memory cell and enables high-speed program and erasure, enables realizing high-speed program and erasure and eliminates the necessity of causing a flowing of a large current when executing program and erasure and which, as a result, has a high level of reliability.

Also, by adopting a memory cell structure wherein a transistor and variable resistive element formed on the semiconductor substrate are connected in parallel and by adopting as the variable resistive element the one having the characteristic that its resistance value varies by applying a voltage with respect to it, since between at the time of reading and at the time of programming the selected/unselected operations for the memory cells are the same in terms of the logical construction, simplifying the peripheral circuits such as a decoder circuit, etc. can also be achieved.

Further, a second characterizing constructional feature of the non-volatile semiconductor memory device according to the present invention resides in that the variable resistive element is formed of the oxide having a perovskite-type structure that contains manganese.

According to the second characterizing constructional feature of the non-volatile semiconductor memory device, it is possible to realize a variable resistive element that enables obtaining a change in resistance that occurs to an extent of one place or two or more places by adjusting the amplitude and width of a pulse voltage applied to both ends of the memory cell, for example, by applying a programming pulse voltage with a voltage amplitude of not more than 7V and with a pulse width of not more than 100 ns and with respect to that, therefore, high-speed and low-power program and erasure can be performed, and it is possible to provide a non-volatile semiconductor memory device which, as a result of that, enables executing high-speed program and erasure.

Also, a third characterizing constructional feature of the non-volatile semiconductor memory device according to the present invention resides in that the memory cell array is constructed in the way that a plurality of memory cell blocks each including a memory cell connected-in-series part wherein a plurality of the memory cells are connected in series are disposed. Further, a fourth characterizing feature of the non-volatile semiconductor memory device according to the present invention resides in that the memory cell block includes, on at least one end of the memory cell connected-in-series part, a selection transistor.

According to the third and fourth characterizing constructional features of the non-volatile semiconductor memory device, the device is made up into a so-called NAND type cell array structure wherein the memory size per bit can greatly be reduced and it is therefore possible to provide a non-volatile semiconductor memory device with respect to which high-speed program and erasure are possible and which therefore has a high level of reliability. Especially, according to the above-described fourth characterizing feature, by connecting in parallel a plurality of the memory cell blocks and connecting one end of each memory cell block to a bit line for applying a reading or programming/erasing voltage, the capacity of the device can be enlarged while limiting the number of memory cells in the memory cell connected-in-series part, namely preventing the great decrease in the reading speed.

Also, a fifth characterizing constructional feature of the non-volatile semiconductor memory device according to the present invention resides in that, in the above-described NAND type cell array structure, the ON-state resistance of the transistor composing the memory cell is lower than a resistance value that falls within a range of change in the resistance value of the variable resistive element that varies in correspondence with the status of data's being kept stored.

According to the above-described fifth characterizing constructional feature of the non-volatile semiconductor memory device according to the present invention, in a case where having applied a prescribed level of reading, programming, or erasing voltage to both ends of the relevant memory cell connected-in-series part, it is possible to suppress to a small value the voltage drop in the memory cell that is kept in a unselected state and it is thereby possible to highly efficiently apply a necessary voltage to both ends of the memory cell that has been selected. Namely, it is possible to make great the change in the electric current flowing through the selected memory cell correspondingly to the status of resistance value of the variable resistive element in the selected memory cell. This enables increasing the reading speed and making large the margin for operation. Also, since the level of the voltage that is applied to both ends of the unselected memory cell can be lowered, it is possible to suppress the program-disturbing phenomenon that when programming of data is performed the data in the unselected memory cell is destroyed.

Further, a first characterizing constructional feature of a driving method for a non-volatile semiconductor memory device according to the present invention is the driving method for the non-volatile semiconductor memory device according to the third to fifth characterizing constructional features and resides in comprising a first step of, at the time of reading of data, with respect to at least the memory cell block that has been selected, making non-conductive the transistor of any one of the memory cells in the memory cell connected-in-series part to thereby select this memory cell, then applying a prescribed level of reading voltage to both ends of the memory cell connected-in-series part, and thereby executing reading of data with respect to the memory cell that has been selected; and a second step of, at the time of programming of data, with respect to at least the memory cell block that has been selected, making non-conductive the transistor of any one of the memory cells in the memory cell connected-in-series part to thereby select this memory cell, then applying a prescribed level of programming voltage to both ends of the memory cell connected-in-series part, and thereby executing programming of data with respect to the memory cell that has been selected.

Further, a second characterizing constructional feature of the driving method for a non-volatile semiconductor memory device according to the present invention resides in further comprising a third step of, at the time of erasure of data, with respect to at least the memory cell block that has been selected, making non-conductive the transistor of any one of the memory cells in the memory cell connected-in-series part to thereby select this memory cell, then applying a prescribed level of erasure voltage to both ends of the memory cell connected-in-series part, and thereby executing erasure of data with respect to the memory cell that has been selected.

According to the above-described characterizing constructional feature of the driving method for a non-volatile semiconductor memory device, in the NAND type cell array structure, by appropriately selecting the voltage that is applied to both ends of the memory cell connected-in-series part, it is possible to execute reading, programming, or erasing of data with respect to the selected memory cell, each, in the same way.

DETAILED DESCRIPTION OF THE INVENTION

An embodiment of a non-volatile semiconductor memory device (hereinafter referred to as "the device of the invention" as the occasion demands) will hereafter be explained with reference to the drawings.

Figure 1:
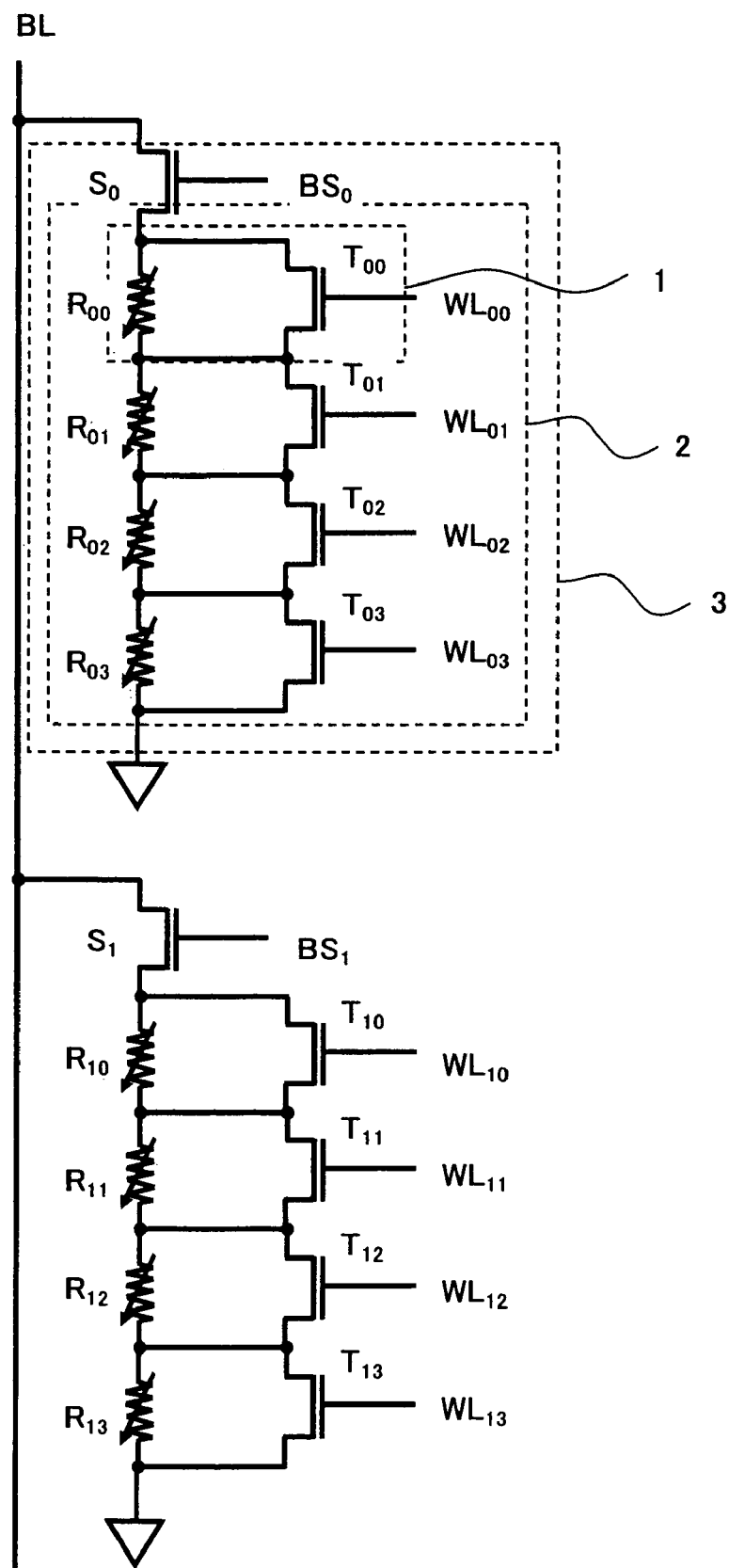
FIG. 1 is an equivalent circuit diagram illustrating a part of a memory cell array according to an embodiment of a non-volatile semiconductor device according to the present invention.

FIG. 1 is a circuit diagram illustrating a part of a memory cell array having a so-called NAND type cell array structure that composes the device of the invention. This figure illustrates an equivalent circuit that represents a basic construction of a memory cell 1 that uses a variable resistive element Rij the resistance value of that varies by applying a voltage with respect thereto.

In the embodiment illustrated in FIG. 1, variable resistive elements Rij that each is a storage carrier for information and cell transistors Tij that each consists of an NMOS transistor are connected in parallel to thereby form a memory cell 1. Further, by four pieces of the memory cell 1 being connected in series, a connected-in-series memory cell part 2 is formed. And, a selection transistor Si consisting of an NMOS transistor is connected in series to one end of the connected-in-series memory cell part 2 to form a memory cell block 3. And, a plurality of the memory cell blocks 3 are connected (two of them are illustrated in FIG. 1) to a bit line BL for executing reading/programming of data. And, the other end side of the memory cell block that is not connected to the bit line BL is connected to a source line (indicated by an earthing symbol in FIG. 1). In this embodiment, the selection transistor Si side of the memory cell block 3 is connected to the bit line BL. Although not illustrated, the bit lines BL are formed more than one piece in the same way and they are regularly arranged, thereby a memory cell array is formed. Gates of the respective transistors Tij of the connected-in-series memory cell part 2 are driven by their corresponding different word lines Wij, whereby, depending on the level of the word lines Wij, the respective transistors Tij are turned on or off. Also, gates of the selection transistors Si are driven by block selection lines BSi, the level of which turns on or off their corresponding selection transistors Si. When the selection transistor Si is in an "on" state, the connected-in-series memory cell part 2 comes into a selected state.

In this embodiment, as the variable resistive element Rij the resistance of that varies depending on applying a voltage, there is used the one that is formed using oxide that contains manganese that has a perovskite type crystal structure, or double-aligned perovskite type crystal structure, that exhibits ultra-gigantic magneto-resistance or high-temperature ultra-high electrical conduction. More specifically, there is used a material that is expressed by a structural formula such as $Pr_{(1-x)}Ca_xMnO_3$, $La_{(1-x)}Ca_xMnO_3$, $Nd_{(1-x)}Sr_xMnO_3$ (0<x<1), $Sr_2FeMoO_6$, $Sr_2FeWO_6$, etc.

Figure 2:
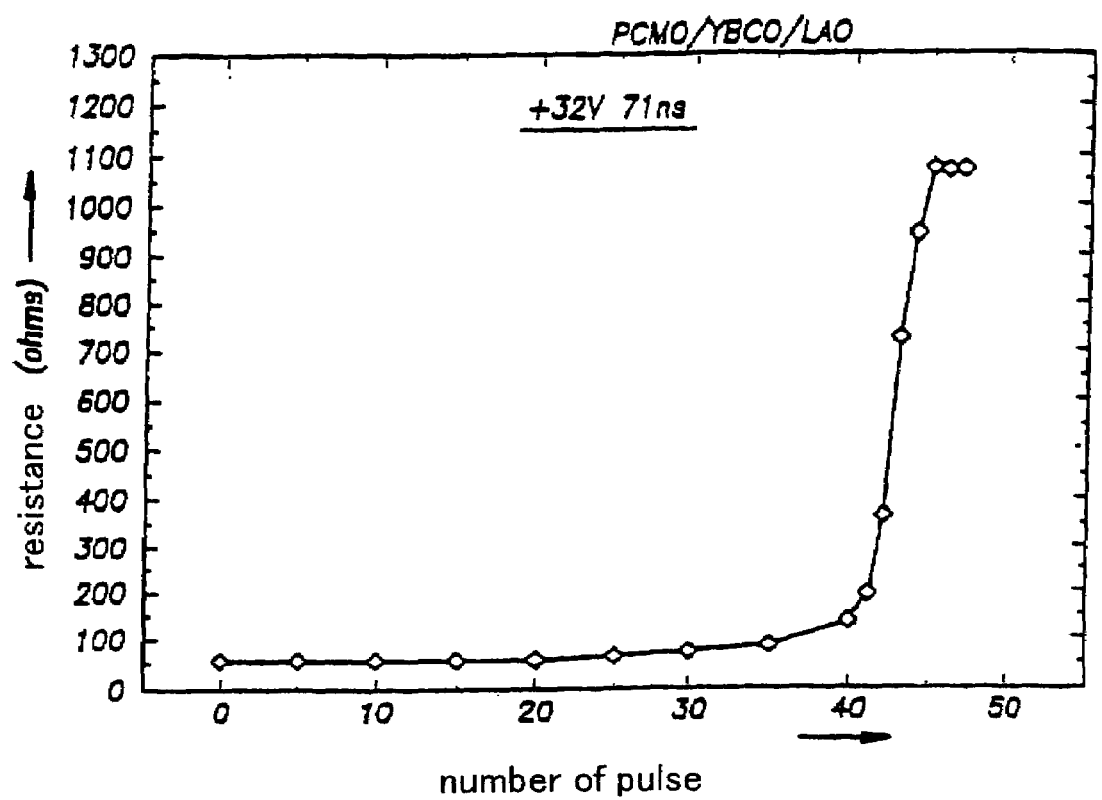
FIG. 2 is a characteristic diagram illustrating the relationship between the voltage amplitude of a programming pulse that is applied to both ends of a variable resistive element used in the non-volatile semiconductor memory device according to the present invention and the electrical resistance of the variable resistive element.
Figure 3:
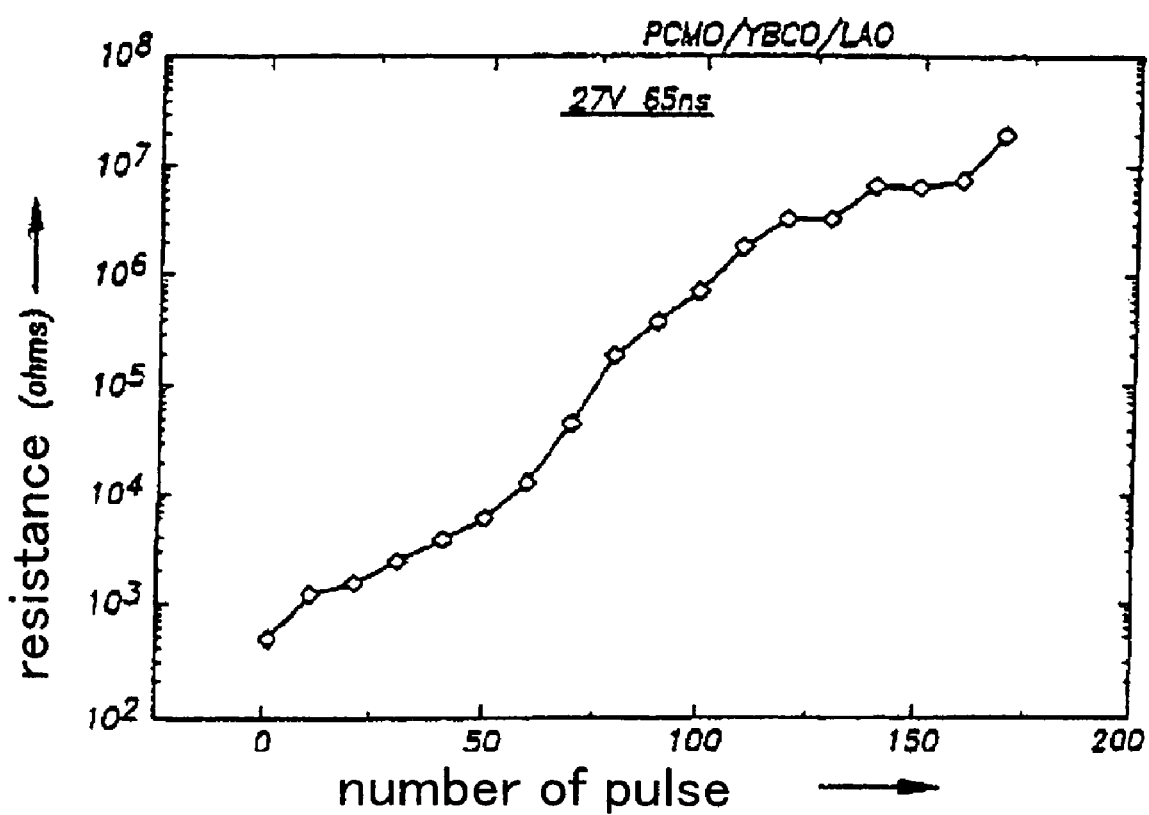
FIG. 3 is another characteristic diagram illustrating the relationship between the voltage amplitude of a programming pulse that is applied to both ends of a variable resistive element used in the non-volatile semiconductor memory device according to the present invention and the electrical resistance of the variable resistive element.

When applying a voltage to the variable resistive element comprised of oxide that contains the above-described manganese, as illustrated in FIGS. 2 and 3 the resistance value of it continuously varies depending on the frequency of applying the pulse, the time length for applying the pulse, and the level of the applied voltage. Resultantly, the rate of change in resistance can be varied from 10 times to 1000 times. FIGS. 2 and 3 illustrate the dependency relationship between the number of the applied pulses and the resistance value that holds true when the manufacturing conditions for specimens and the applying conditions for pulse (FIG. 2 corresponds to a case where a pulse is applied whose peak voltage is 32V continuously during a time length of 71 ns while FIG. 3 corresponds to a case where a pulse is applied whose peak voltage is 27V continuously during 65 ns) are varied. The figures indicate that, although the characteristic varies from one figure to another depending on the relevant conditions, the resistance value increases depending on the increase in the applied voltage pulse. Since the resistance value that has varied depending on applying a pulse voltage is maintained as is even after this application has been stopped, it is possible to perform non-volatile storing of data into the memory cell using this variable resistive element.

Accordingly, if, while the variable resistive element Rij of each memory cell 1 is selected, applying a prescribed level of programming voltage to both ends of it, it is possible to vary that resistance value and, using the resistance value that has thus been varied, perform storing of multi-level data such as 2-level data or 3-level, or more than 3-level, data. Also, since the resistance value of the variable resistive element Rij continuously varies, when a thought is given of an independent memory cell unit, it is also possible to perform storing of analog data, too. Also, since the variable resistive element that is made using the above-described oxide containing manganese is from several tens of nano-seconds to 200 nano-seconds in terms of programming length of time with respect thereto, the programming speed of that element is fast even when compared to that in case of the NAND type flash EEPROM, the programming speed of which is given in milliseconds (in a case where FN tunnel programming is executed). Regarding erasure, it can be performed by applying a voltage of the opposite polarity during a time length of several tens of nano-seconds to 200 nano-seconds, or by applying the same voltage as that in case of programming for a long period of time (given in not more than microseconds). In the case, as well, of erasure, the speed is similarly fast in comparison with the time length given in milliseconds that applies to the NAND type flash EEPROM.

Figure 19:
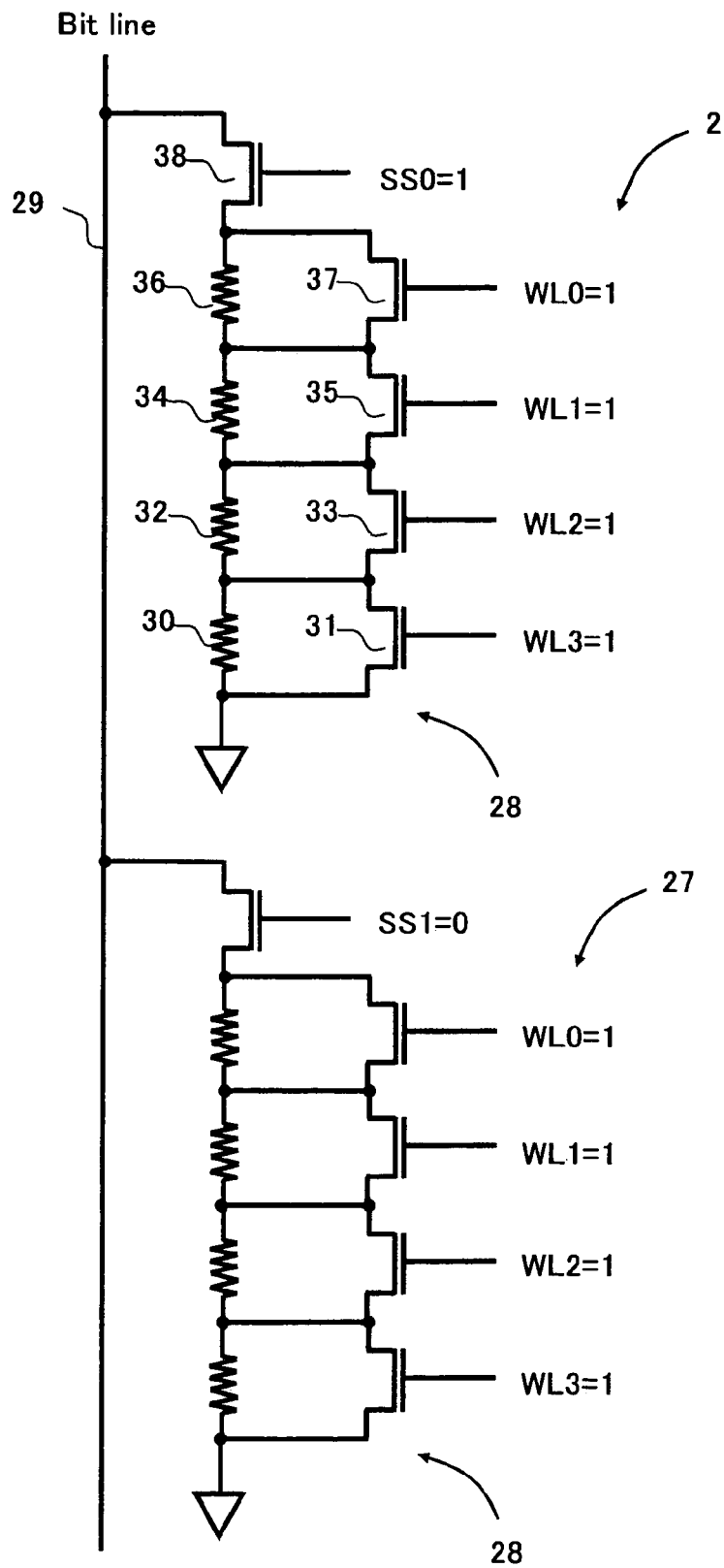
FIG. 19 is an equivalent circuit diagram illustrating a memory cell array of a conventional NAND type MRAM.
Figure 20:
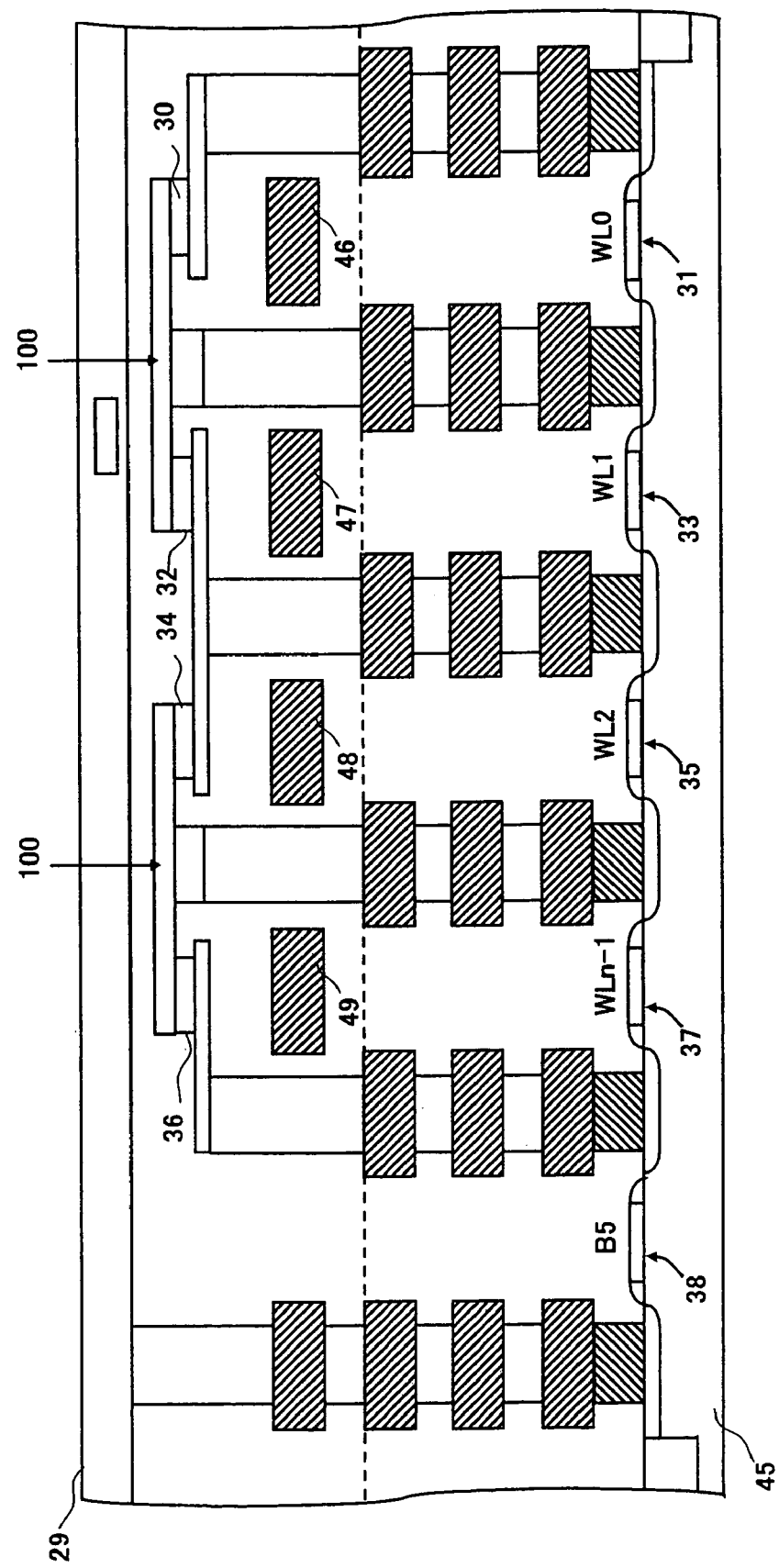
FIG. 20 is a sectional view illustrating an elemental structure of the memory cell array of the conventional NAND type MRAM, illustrated in FIG. 2.
Figure 21:
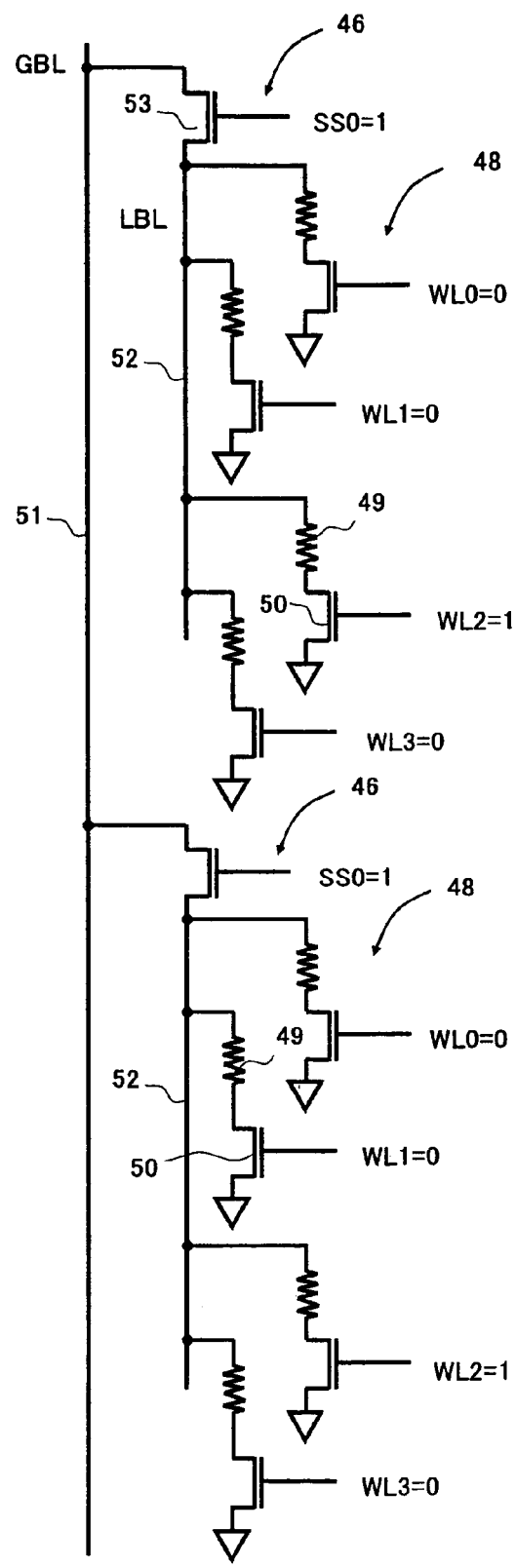
FIG. 21 is an equivalent circuit diagram illustrating a memory cell array of a conventional NOR type MRAM.
Figure 22:
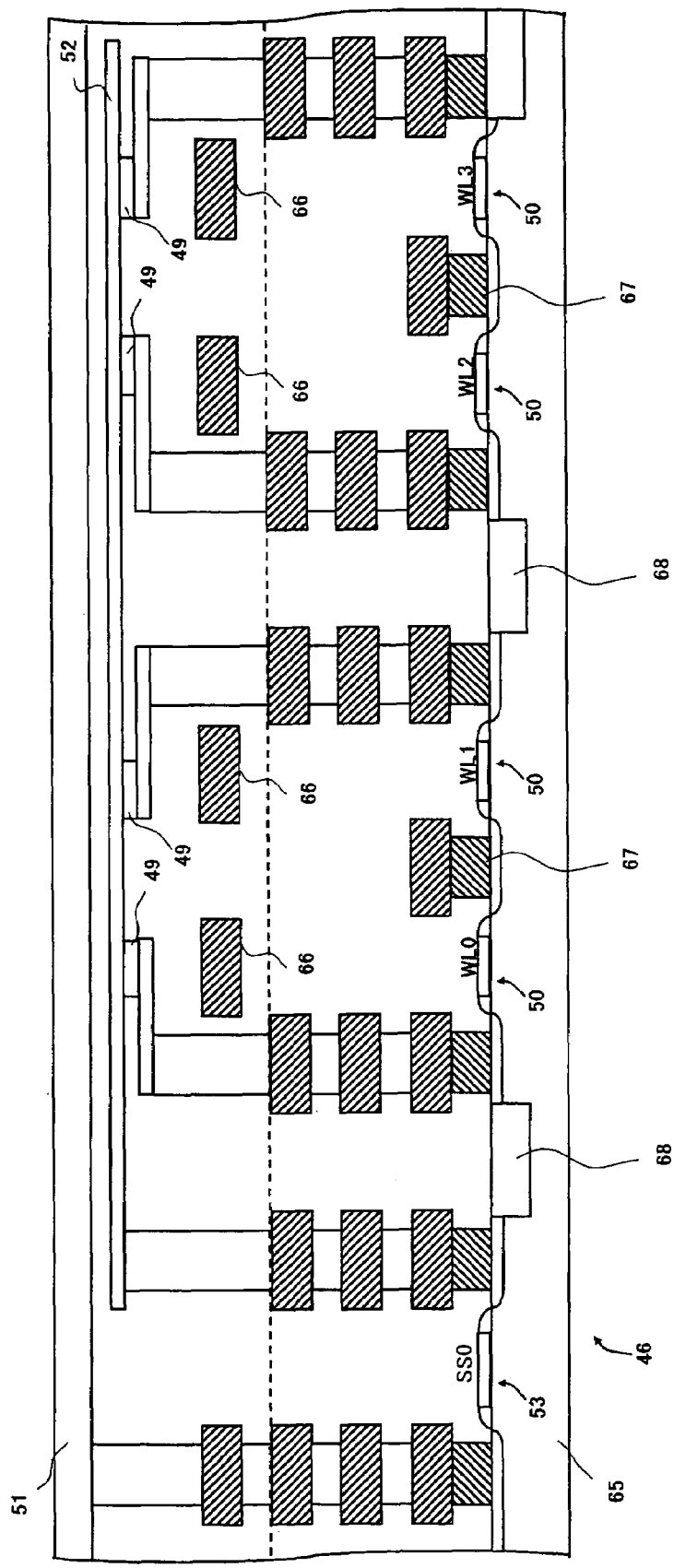
FIG. 22 is a sectional view illustrating an elemental structure of the memory cell array of the conventional NOR type MRAM illustrated in FIG. 21.

Although the memory cell array according to this embodiment illustrated in FIG. 1 has similarity to the memory cell array construction of the NAND type MRAM illustrated in FIG. 19, it characteristically differs in that it uses, as the storage carrier for information, the variable resistive element Rij the resistance value of which varies depending on applying a voltage. Regarding one memory cell that uses a resistive element such as an MRAM or OUM (=Ovonic Unified Memory, A non-volatile semiconductor memory technique that uses a phase change film as a storing element), as illustrated in FIG. 21 or 22 the cell transistor and resistive element were conventionally connected in series. However, in the device of the invention, as illustrated in FIG. 1, by using this variable resistive element Rij and NAND type cell array structure in physical and electrical combination, the compatibility between the high degree of integration and high speed of operation that was difficult in the prior art has been realized.

Next, the operation of the device of the present invention will be explained using FIG. 1. When the device is in a state of standby (the device is kept out of any of the reading, programming, and erasing operations), all of the word lines WL00 to WL03 and word lines WL10 to WL13 are kept having a signal level of "H" (high level) and the block selection lines BS0 and BS1 are each kept having a signal level of "L" (low level). At this time, all of the cell transistors Tij are kept in an "on" state while the selection transistor Si is kept in an "off" state. And, irrespective of the signal level of the bit line BL, both ends of the respective variable resistive element Rij are electrically short-circuited by the cell transistor Tij connected in parallel with respect thereto and in consequence are kept having the same potential. Since, during a state of standby that persists for a long period of time, the both ends of the variable resistive element Rij are always kept short-circuited, even when leak current occurs at the pn junction of the cell transistor Tij, the difference in potential between the both ends of the variable resistive element Rij is 0V. Therefore, no electric current flows between the two, for which reason, data that is stored therein is not destroyed.

Next, a consideration is given of selecting any one memory cell 1 of the connected-in-series memory part 2. For example, lets consider selecting the memory cell 1A ($T_{02}$, $R_{02}$) that is the second from the source line of the connected-in-series memory cell 2 on the upper side of FIG. 1 and that is the third from the selection transistor $S_0$.

Only the cell transistor $T_{02}$ is transited from the "on" state to the "off" state. Subsequently, the block selection line $BS_0$ of the memory cell block 3 that has been selected is transited from the "L" to the "H", thereby transiting only the selected transistor $S_0$ from the "off" to the "on" state. As a result of this, in the memory cell block 3 that has been selected, the first, third, and fourth cell transistors $T_{03}$, $T_{01}$, and $T_{00}$ that have been counted from the source line side are respectively in the "on" states, and the cell transistor $T_{02}$ composing the memory cell 1 that has been selected the second from the source line side is in the "off" state. Accordingly, one end of the variable resistive element $R_{02}$ of the memory cell 1A that has been selected is electrically connected to the source line that is kept having an earth potential while, on the other hand, the other end is electrically connected to the bit line BL via the selected transistor $S_0$.

Figure 4:
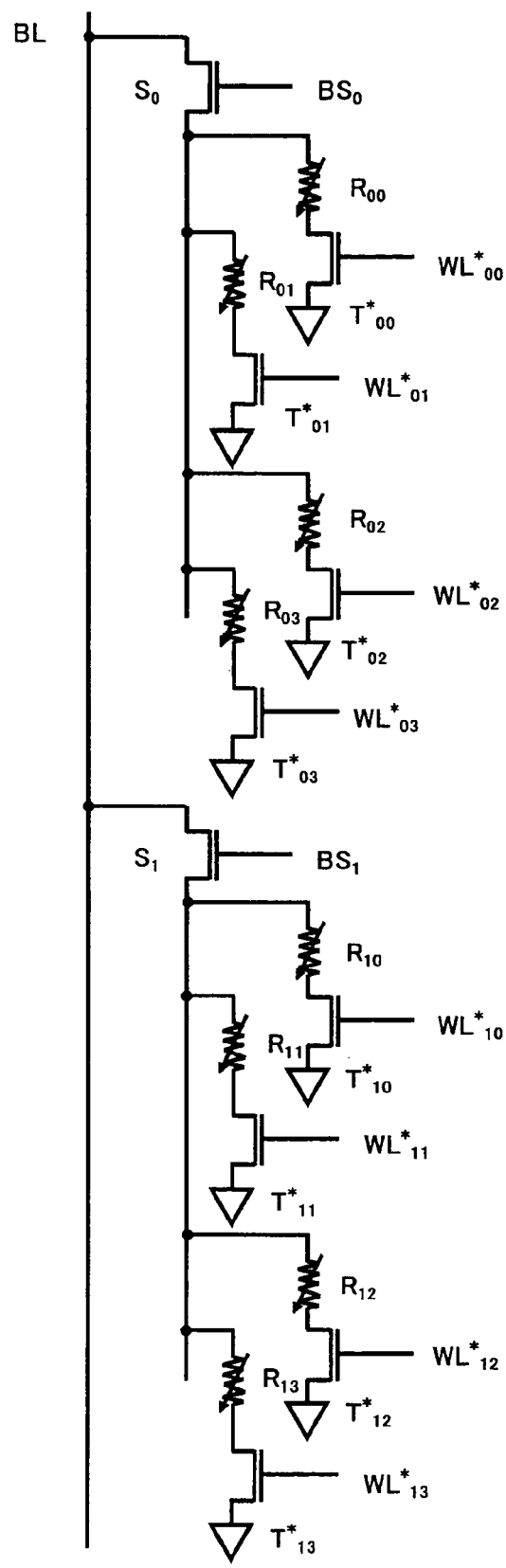
FIG. 4 is an equivalent circuit diagram that has been prepared by converting the memory cell array according to the embodiment of the non-volatile semiconductor memory device of the present invention that is illustrated in FIG. 1 to NOR type cell array structure.

Meanwhile, the circuit construction of this embodiment becomes the one that from the standpoint of logical operation is equivalent to the following NOR type memory cell array. Namely, as illustrated in FIG. 4, the variable resistive element Rij and the cell transistor T*ij are connected in series to provide a memory cell 4. These memory cells 4 are connected in parallel to provide a connected-in-parallel memory cell part 5. And, this connected-in-parallel memory cells 5 is connected to the bit line BL via the selection transistor Si. This NOR type memory cell array construction becomes the same as the memory cell array construction of FIG. 21 that was explained in the Description of the Related Art. Here, the cell transistors T*ij become equivalent to an arrangement wherein the cell transistors other than the cell transistor Tij in the connected-in-series memory cell part 2 are composed in the form of their being in series. Therefore, the word lines WL*ij for driving the gates of them have their signal levels "H" and "L" inverted from those of the word lines WL*ij illustrated in FIG. 1. The variable resistive elements Rij have their correspondence relationship maintained between FIG. 1 and FIG. 4.

Accordingly, even if adopting the NAND type cell array structure by connecting in series the memory cells 1 using the variable resistive elements Rij, it is possible to execute reading, programming, etc. of data with respect to an arbitrary one of the memory cells 1. Thereby, random access becomes possible in its sense that is perfect.

Regarding the voltage that is applied when executing programming, to the selected bit line BL there is applied a programming voltage of Vpgm (for example, 5V); to each of the unselected word lines $WL_{03}$, $WL_{01}$, and $WL_{00}$ there is applied an ON-state voltage Von (for example 3V) for the cell transistor Tij; and to the selected word line $WL_{02}$ there is applied a voltage of Vss (=0V). Then, when it is assumed that the ON-resistance of each transistor be ignored, the voltage Vpgm is applied to the bit line BL line side of the variable resistive element $R_{02}$ of the selected memory cell 1A and the voltage Vss is applied to the source line side of it. Thereby, programming is executed.

Regarding the voltage that is applied when executing erasure, to the bit line BL there is applied a voltage Vera (for example −5V) of the opposite polarity to that of the programming voltage; to each of the unselected word lines $WL_{03}$, $WL_{01}$, and $WL_{00}$ there is applied an ON-state voltage Von (for example 3V) for the cell transistor Tij; and to the selected word line $WL_{02}$ there is applied a voltage Vss (=0V). Then, if assuming that the ON-state resistance of each transistor be ignored, the voltage Vera is applied to the bit line BL side of the variable resistive element $R_{02}$ of the selected memory cell 1A while the Vss is applied to the source line side. Thereby, erasure is executed.

Also, when executing reading, an attempt is made to prevent the resistance value of the variable resistive element $R_{02}$ of the selected memory cell 1 from being varied due to the voltage applied thereto. To this end, to the bit line BL there is applied a voltage Vread (for example 2V) that is lower than the programming voltage; to each of the unselected word lines $WL_{03}$, $WL_{01}$, and $WL_{00}$ there is applied an ON-state voltage Von (for example 3V) for the cell transistor Tij; and to the selected $WL_{02}$ there is applied a voltage Vss (=0V). Then, if assuming that the ON-state resistance of each transistor be ignored, the Vread is applied to the bit line BL side of the variable resistive element $R_{02}$ of the selected memory cell 1A while, on the other hand, the voltage Vss is applied to the source line side. As a result of this, using the variation in the electric current flowing through the bit line BL, it is possible to reading the stored data that is made corresponding to the resistance value of the variable resistive element $R_{02}$ of the selected memory cell 1A.

Here, in the memory cell block 3 that has been selected in the NAND type cell array structure illustrated in FIG. 1, the ON-state resistance of the unselected cell transistors $T_{03}$, $T_{01}$, and $T_{00}$ that are kept in their "on" state does not actually has a value of "0". Therefore, it results that to the both ends of each unselected memory cell 1 there is kept applied a prescribed level of voltage. Accordingly, it results that, regarding the reading voltage or programming voltage that is applied to the bit line BL when executing reading or programming, as this voltage the one that has been obtained by subtracting the voltages that correspond to the voltage drops in the unselected memory cell 1 and selected transistor $S_0$ is applied to the both ends of the variable resistive element $R_{02}$ of the selected memory cell 1A. Accordingly, the voltage that is necessary for reading or programming with respect to the memory cell grasped as an independent unit needs to be applied to the bit line BL by taking the voltage corresponding to that voltage drop into consideration.

Further, it is preferable that the ON-state resistance of the cell transistor Tij be lower than a value that falls with the range of variation in the resistance value of the variable resistive element Rij that varies correspondingly to the stored state of data. In other words, the combined resistance of the kept-"on" cell transistors $T_{03}$, $T_{01}$, and $T_{00}$ in the unselected memory cell 1 and the variable resistive element $R_{03}$, $R_{01}$, and $R_{00}$ becomes further low as compared to the resistance value of the variable resistive element $R_{02}$ of the selected memory cell 1A. Therefore, in the state where reading voltage or programming voltage is kept applied to the bit line BL, the voltage that is applied to the both ends of the variable resistive element $R_{02}$ of the selected memory cell 1A that is an object with respect to which reading or programming is executed can be set so that it reliably becomes higher than the voltage that is applied to each both ends of the variable resistive elements $R_{03}$, $R_{01}$, and $R_{00}$ of the unselected memory cell 1. For this reason, it is possible to arrange that the voltage that is necessary for reading or programming be selectively applied only to the variable resistive element $R_{02}$ of the selected memory cell 1A while, on the other hand, a low voltage that is prevented from erroneously becoming a programming voltage is applied to the variable resistive elements $R_{03}$, $R_{01}$, and $R_{00}$ of the other unselected memory cells 1.

Figure 5:
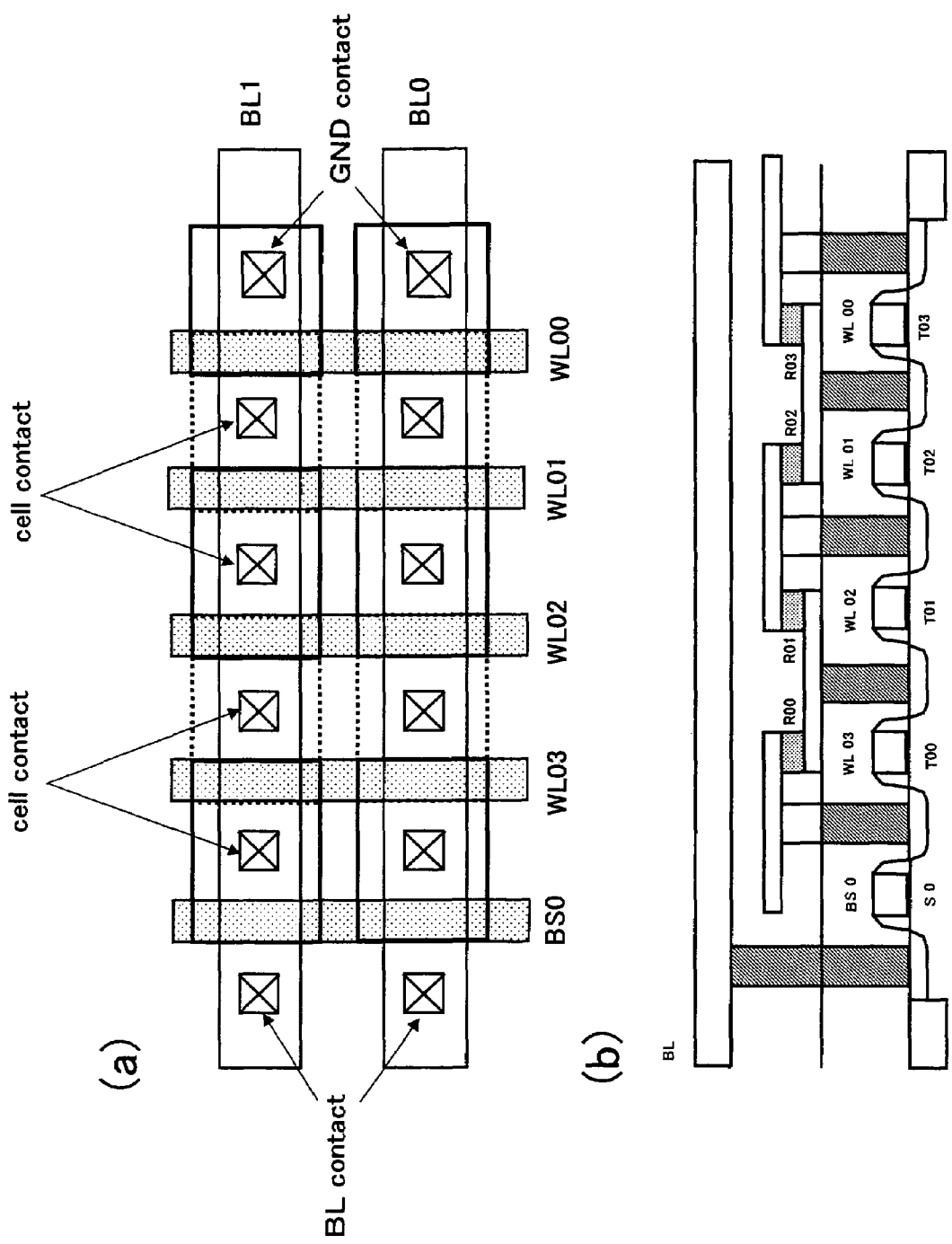
FIGS. 5(a) and 5(b) are a plan view (a) illustrating a part of the layout of the memory cell array according to the embodiment of the non-volatile semiconductor memory device of the present invention and a sectional view (b) of an elemental structure of that memory cell array.

FIGS. 5(a) and 5(b) are views schematically illustrating the concrete elemental construction on a relevant semiconductor substrate for realizing the circuit construction of the NAND type cell array structure by connecting in series the memory cells 1 using the variable resistive elements Rij of FIG. 1. FIG. 5(a) is a plan view concerned therewith and FIG. 5(b) is a sectional view concerned therewith. As illustrated in FIG. 5, the variable resistive elements $R_{00}$, $R_{01}$, $R_{02}$, and $R_{03}$ are formed over the cell transistors $T_{00}$, $T_{01}$, $T_{02}$, and $T_{03}$. Also, the bit line BL is connected to the drain region of the selected transistor $S_0$ and is formed over the respective variable resistive elements Rij. As the memory cell structure, the gate layer of the cell transistor Tij can be formed with a minimum machining dimension (F) and, in addition, the active regions for forming the diffusion layer and channel region can be formed with a minimum machining dimension (F). Therefore, the transistor is a planar transistor that is easy to manufacture and, furthermore, the size of one piece of memory cell can be reduced to $2F \times 2F = 4F^2$. Also, in a case where the machining dimension for the bit line BL is greater than F as a result of using Al wiring, etc. (for example, in a case where the line width is 1.5F), the size of the memory cell becomes $2F \times 3F = 6F^2$.

The size of the memory cell of the NAND type cell array structure can be reduced to approximately a half of the size of the memory cell of the NOR type cell array structure illustrated in FIG. 4 (the size ($8F^2$ to $10F^2$) equal to that of the NOR type flash memory). As a result of this, the unit price of bit of the device of the invention becomes low, with the result that it is possible to achieve the increase in the capacity of the memory with the same manufacturing cost. Also, regarding the same capacity of memory, the chip size becomes small and doesn't occupy a large space therefor. This enables realizing high density of mounting. Furthermore, since the chip size is small, the device also has a feature of having a high level of strength against the stress.

Figure 6:
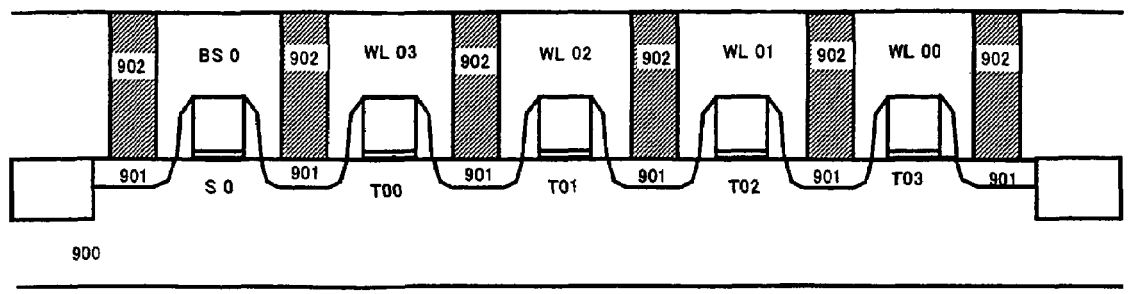
FIG. 6 is a sectional process step view illustrating a part of the manufacturing process steps for the memory cell array of the non-volatile semiconductor memory device of the present invention.

FIGS. 6 to 14 illustrate a method of manufacturing the device of the invention. In the ordinary CMOS process, the cell transistor Tij and selected transistor Si are formed in a p-type substrate or p-type well region 900. After forming the transistors, from the n+-type diffusion region 901 between adjoining two of the gates, the source and drain electrodes of the transistor are uplifted to an upper stage of layer by forming relevant plugs 902 (FIG. 6).

Figure 7:
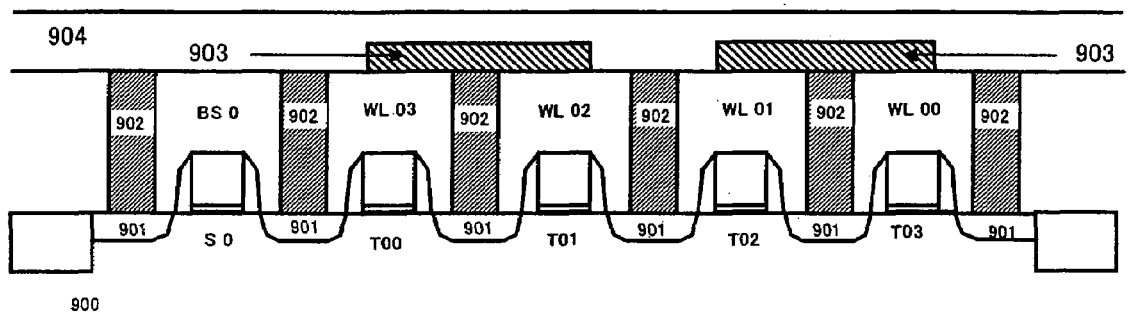
FIG. 7 is a sectional process step view illustrating a part of the manufacturing process steps for the memory cell array of the non-volatile semiconductor memory device of the present invention.
Figure 8:
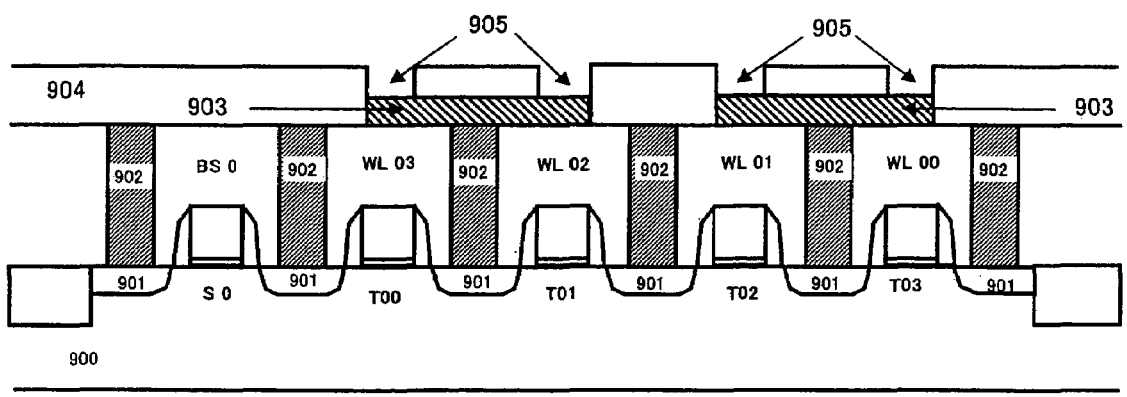
FIG. 8 is a sectional process step view illustrating a part of the manufacturing process steps for the memory cell array of the non-volatile semiconductor memory device of the present invention.
Figure 9:
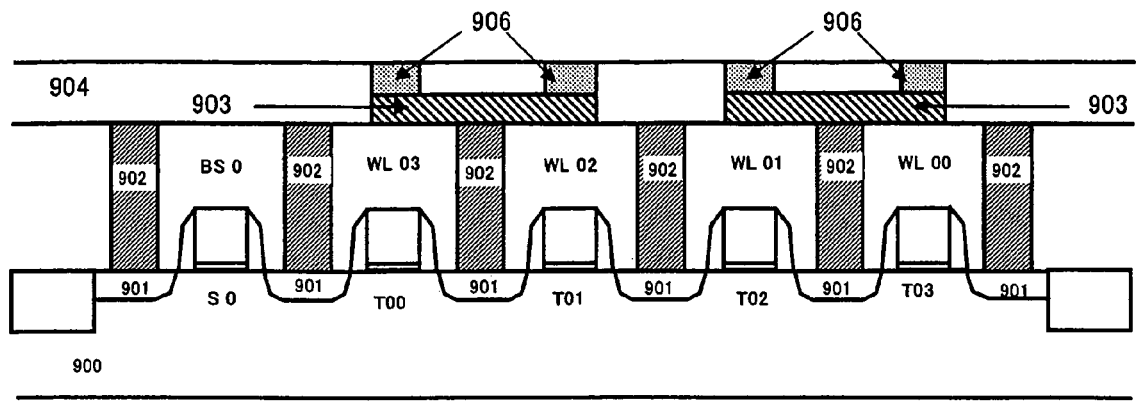
FIG. 9 is a sectional process step view illustrating a part of the manufacturing process steps for the memory cell array of the non-volatile semiconductor memory device of the present invention.
Figure 10:
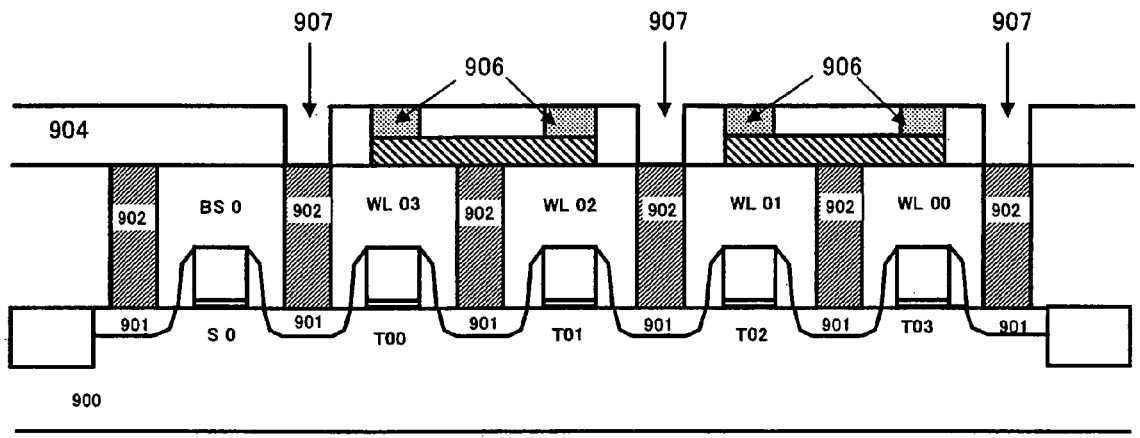
FIG. 10 is a sectional process step view illustrating a part of the manufacturing process steps for the memory cell array of the non-volatile semiconductor memory device of the present invention.
Figure 11:
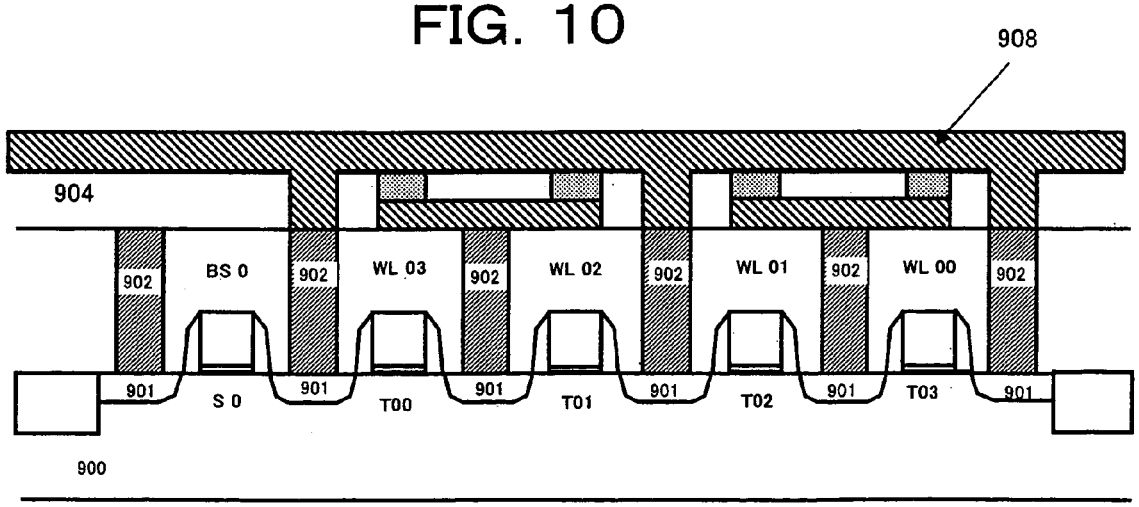
FIG. 11 is a sectional process step view illustrating a part of the manufacturing process steps for the memory cell array of the non-volatile semiconductor memory device of the present invention.
Figure 12:
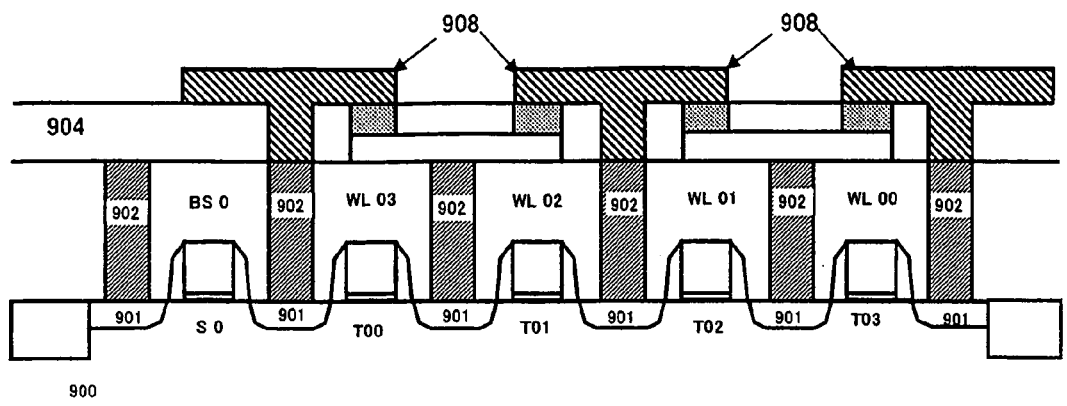
FIG. 12 is a sectional process step view illustrating a part of the manufacturing process steps for the memory cell array of the non-volatile semiconductor memory device of the present invention.
Figure 13:
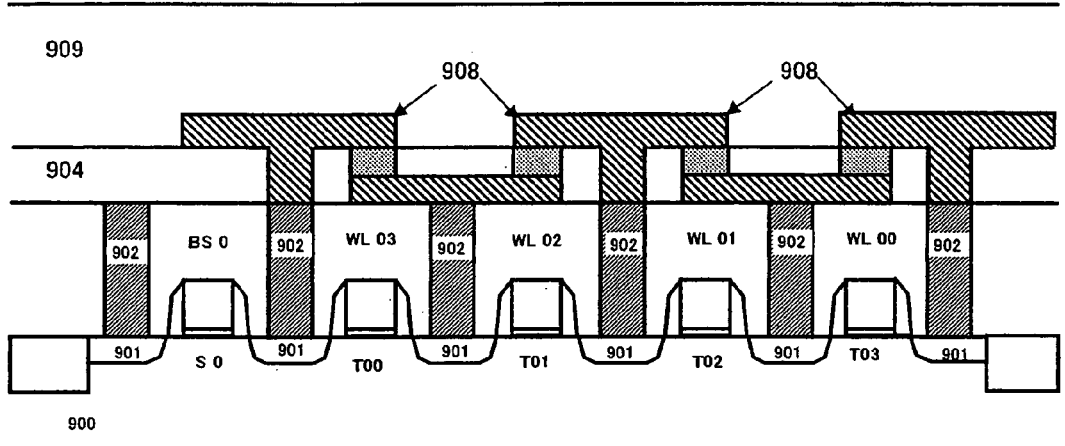
FIG. 13 is a sectional process step view illustrating a part of the manufacturing process steps for the memory cell array of the non-volatile semiconductor memory device of the present invention.
Figure 14:
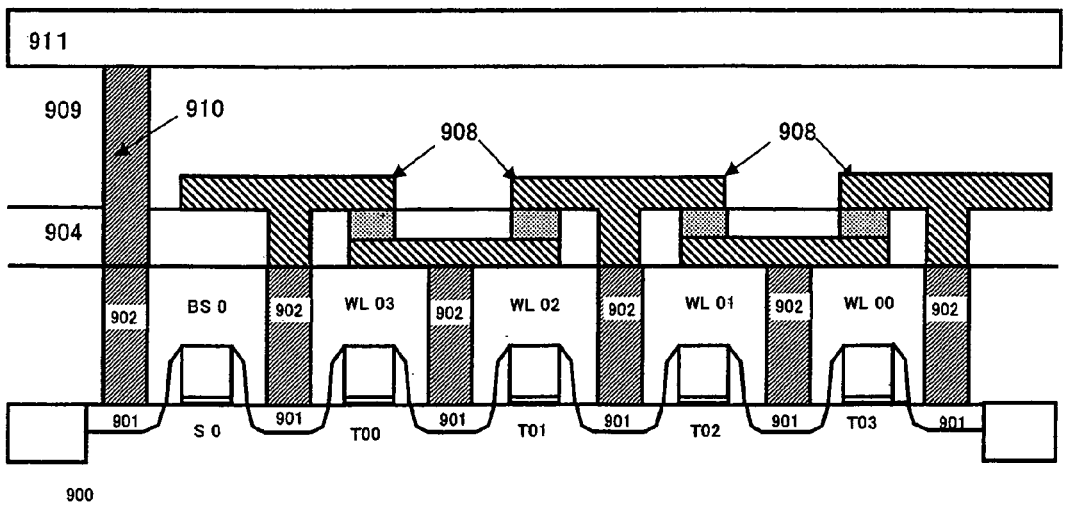
FIG. 14 is a sectional process step view illustrating a part of the manufacturing process steps for the memory cell array of the non-volatile semiconductor memory device of the present invention.
Figure 15:
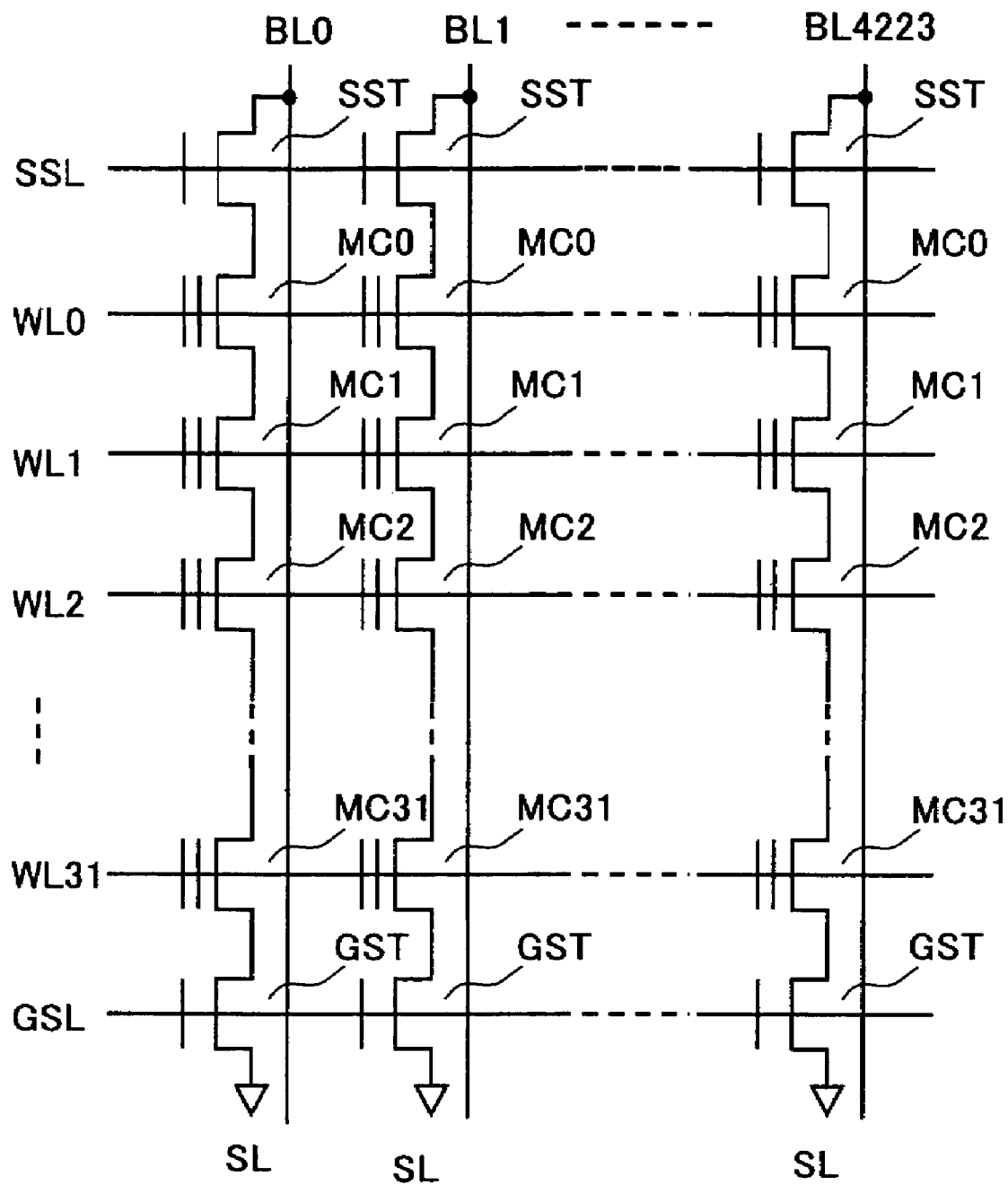
FIG. 15 is an equivalent circuit diagram illustrating a memory cell array of a conventional NAND type flash EEPROM.
Figure 16:
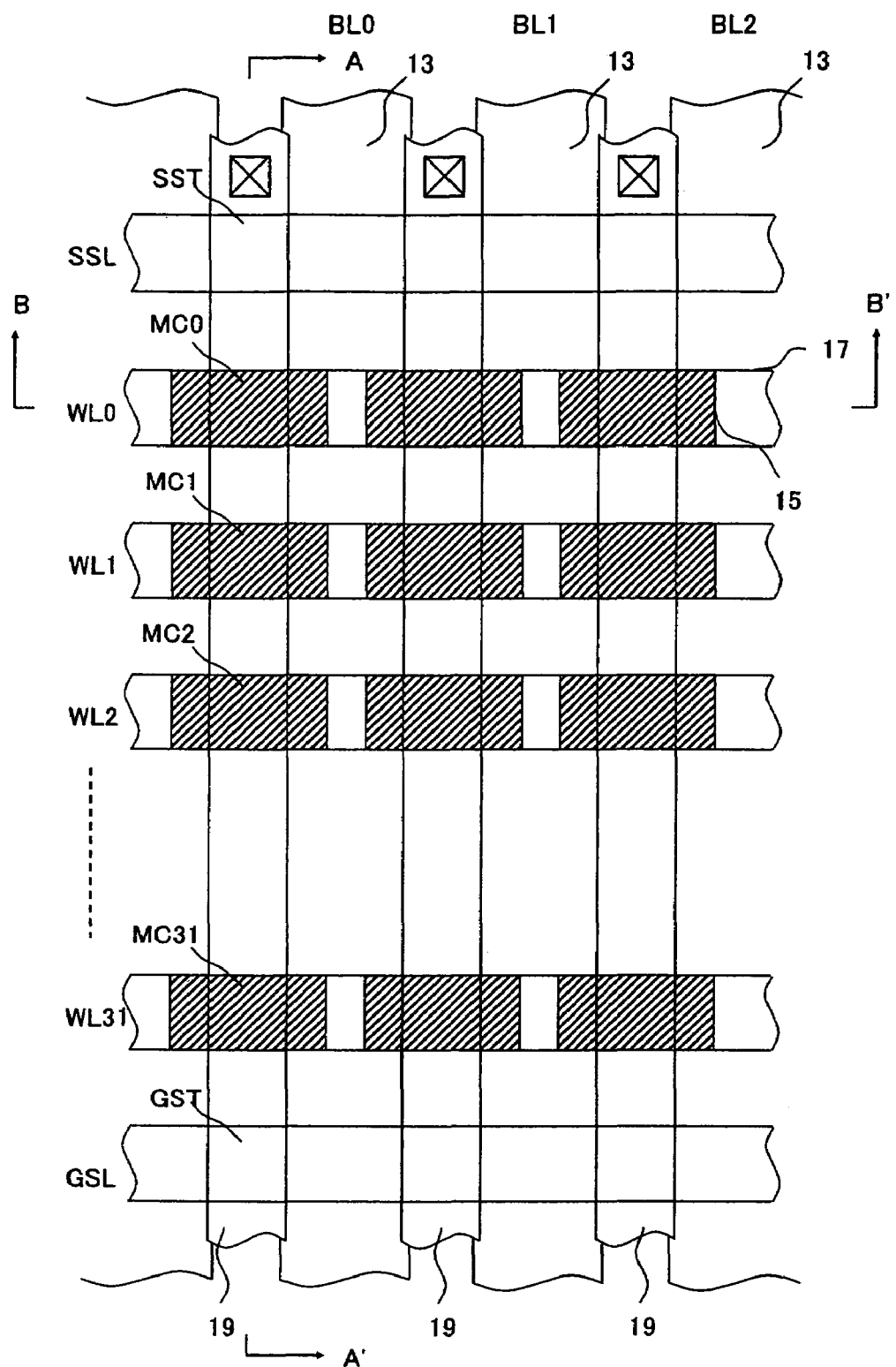
FIG. 16 is a plan view illustrating a layout that corresponds to the equivalent circuit diagram of the memory cell array of the conventional NAND type flash EEPROM, illustrated in FIG. 15.
Figure 17:
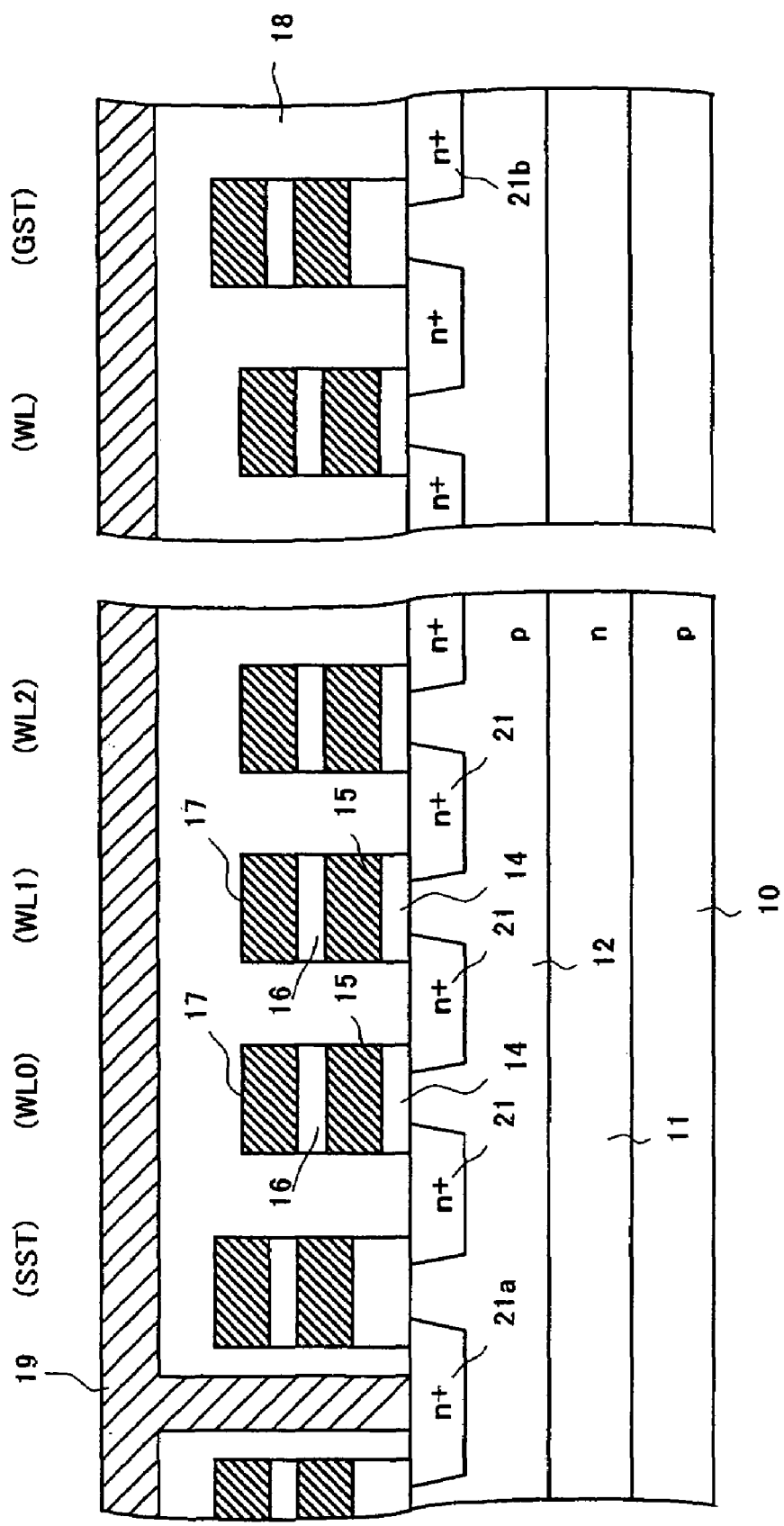
FIG. 17 is a sectional view illustrating an elemental structure, taken along a line A–A' of the plan layout view of FIG. 16.
Figure 18:
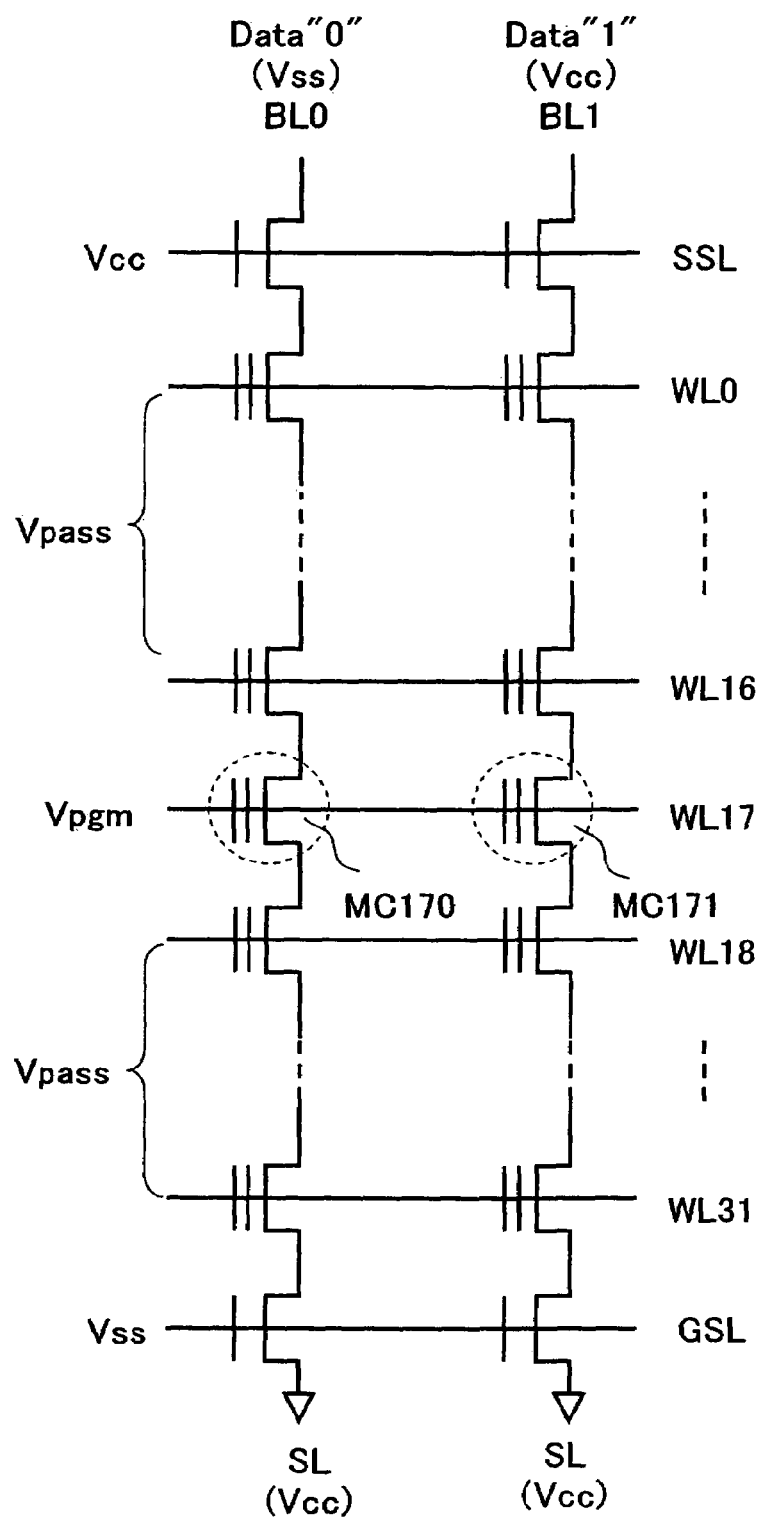
FIG. 18 is a view illustrating the operation of the memory cell array of the conventional NAND type flash EEPROM, illustrated in FIG. 15.

Next, a lower electrode 903 for the variable resistive element Rij is formed on one 902 of the plugs for the source and drain electrodes of the cell transistor Tij. Thereafter, an insulating layer 904 is formed (FIG. 7). After that, an opening 905 is formed over the lower electrode 903 (FIG. 8). A resistive element film is formed and is embedded into the opening 905. Then, using a CMP technique, flattening is performed to form the variable resistive element Rij (906) (FIG. 9). For forming the upper electrodes, an opening 907 is formed (FIG. 10), and the upper electrode 908 is formed and is embedded into each of those openings 907 (FIG. 11). After that, using photolithography and anisotropic etching technique, the upper electrode 908 is fabricated (FIG. 12). After forming an inter-layer insulating film 909, flattening is performed with the CMP technique (FIG. 13). For forming the bit line BL, after forming a via-hole, a tungsten plug 910 is formed. After that, metal wiring that becomes the bit line BL is formed. This metal wiring is fabricated using photolithography and anisotropic etching technique to form the bit line BL (911). In the way that has been described above, it becomes possible to manufacture the memory array of the NAND type cell array structure that uses the variable resistive element Rij (906) as a carrier for storage of information.

As has been described above, according to the present invention, by connecting the transistors and the corresponding variable resistive elements in parallel to construct a memory cell, it is possible to realize a memory cell the cell area of which is small and it is also possible for the resulting device to have a function, as well, to execute random access. More specifically, in the present invention, as the variable resistive element (a carrier for stored information), there has been used the one that has been formed using oxide that contains manganese therein that has a perovskite type crystal structure or double-aligned perovskite type crystal structure. As a result of this, as was explained before using FIG. 6, the programming length of time has become as short as several tens of nano-seconds to 200 nano-seconds, and the erasing length of time has become as short as given in microseconds or less. Like this, random access that is very fast as the non-volatile semiconductor memory device has become possible. Accordingly, the compatibility between the high-degree of integration (the small cell area) and the high-speed access that was conventionally difficult to realize has now become possible to achieve through the use of the present invention.

Further, since depending on the applying conditions under which the programming voltage is applied as pulses it is possible to continuously increase the rate of change in the resistance of the variable resistive element from 10 times to 1000 times as high, applying the technique of the invention to multi-level storage that is done with one piece of memory cell, and that in case of the MRAM was difficult to realize in terms of its principle becomes easy to execute. Therefore, if the number of memory cells is the same, increasing the capacity is realized, while, if the capacity is the same, reducing the cost is realized.

Further, in the manufacture of the device of the invention, as far as concerning until forming the cell transistors and block selection transistor, it is possible to use a general CMOS process. Therefore, manufacturing the device of the invention doesn't need to use any special process steps. As a result of this, it is possible to suppress the increase in the cost for the process and, at the same time, it becomes easy to integrate with a combined use of the logical circuit that is formed in the CMOS process.

Also, if the capacity is the same, the invention enables making small the size of the chip that composes the semiconductor memory device. Therefore, the device of the invention has a high level of mechanical strength with respect to the stress as well and it is therefore possible to provide a semiconductor memory device that is optimum even to the use purposes such as portable telephones the use of that is made in hard and severe environments.

Furthermore, programming and erasing operations are controlled with a voltage that is applied as pulses and no large electric currents become needed. This enables avoiding the coming-up of the electro-migration problem, thereby a high reliability is obtained.

Although the present invention has been described in terms of a preferred embodiment, it will be appreciated that various modification and alterations might be made by those skilled in the art without departing from the spirit and scope of the invention. The invention should therefore be measured in terms of the claims which follow.

What is claimed is:

1. A non-volatile semiconductor memory device, comprising
    a memory cell array which includes a plurality of memory cells disposed in array, wherein the memory cell includes a transistor that is formed on a semiconductor substrate, and a variable resistive element that is connected between a source and drain terminals of the transistor and the resistance value of that varies by applying a voltage.

2. The non-volatile semiconductor memory device according to claim 1, wherein
    the variable resistive element is formed of the oxide having a perovskite-type structure that contains manganese.

3. The non-volatile semiconductor memory device according to claim 1, wherein
    the memory cell array is constructed in the way that a plurality of memory cell blocks each including a memory cell connected-in-series part wherein a plurality of the memory cells are connected in series are disposed.

4. The non-volatile semiconductor memory device according to claim 3, wherein
    the memory cell block includes, on at least one end of the memory cell connected-in-series part, a selection transistor.

5. The non-volatile semiconductor memory device according to claim 3, wherein
    the ON-state resistance of the transistor composing the memory cell is lower than a resistance value that falls within a range of change in the 32 resistance value of the variable resistive element that varies in correspondence with the status of data's being kept stored.

6. A driving method for a non-volatile semiconductor memory device, the non-volatile semiconductor memory device including a memory cell array; and
    the memory cell array being constructed in the way that there are disposed a plurality of memory cell blocks each of that includes a memory cell connected-in-series part wherein a plurality of memory cells are connected in series, each memory cell including a transistor that is formed on a semiconductor substrate, and a variable resistive element that is connected between a source and drain terminals of said transistor and the resistance value of that varies by applying a voltage,
    comprising a first step of, at the time of reading of data, with respect to at least the memory cell block that has been selected, making non-conductive the transistor of any one of the memory cells in the memory cell connected-in-series part to thereby select this memory cell, then applying a prescribed level of reading voltage to both ends of the memory cell connected-in-series part, and thereby executing reading of data with respect to the memory cell that has been selected; and
    a second step of, at the time of programming of data, with respect to at least the memory cell block that has been selected, making non-conductive the transistor of any one of the memory cells in the memory cell-connected-in-series part to thereby select this memory cell, then applying a prescribed level of programming voltage to both ends of the memory cell connected-in-series part, and thereby executing programming of data with respect to the memory cell that has been selected.

7. The driving method for a non-volatile semiconductor memory device according to claim 6, further comprising:
    a third step of, at the time of erasure of data, with respect to at least the memory cell block that has been selected, making non-conductive the transistor of any one of the memory cells in the memory cell connected-in-series part to thereby select this memory cell, then applying a prescribed level of erasure voltage to both ends of the memory cell connected-in-series part, and thereby executing erasure of data with respect to the memory cell that has been selected.

* * * * *